United States Patent [19]

Wells et al.

[11] Patent Number: 5,265,059

[45] Date of Patent: Nov. 23, 1993

[54] CIRCUITRY AND METHOD FOR DISCHARGING A DRAIN OF A CELL OF A NON-VOLATILE SEMICONDUCTOR MEMORY

[75] Inventors: Steven E. Wells, Citrus Heights; Owen W. Jungroth, Sonora; Mickey L. Fandrich, Placerville, all of Calif.

[73] Assignee: Intel Corporation, Santa Clara, Calif.

[21] Appl. No.: 698,547

[22] Filed: May 10, 1991

[51] Int. Cl.[5] ............................................. G11C 11/40
[52] U.S. Cl. ..................... 365/204; 365/185; 365/900
[58] Field of Search ................. 365/900, 104, 185, 204

[56] References Cited

U.S. PATENT DOCUMENTS

| | | | |
|---|---|---|---|
| 4,301,535 | 11/1981 | McKenny et al. | 365/185 |
| 4,677,590 | 6/1987 | Arakawa | 365/185 |
| 4,720,816 | 1/1988 | Matsuoka et al. | 365/104 |
| 4,905,197 | 2/1990 | Urai | 365/204 |
| 4,937,787 | 6/1990 | Kobatake | 365/185 |
| 5,065,364 | 11/1991 | Atwood et al. | 365/900 |

OTHER PUBLICATIONS

"Intel Corporation Memory Components Handbook", pp. 5-47 through 5-69 and pp. 5-115 through 5-118 (Intel 1989).

Primary Examiner—John S. Heyman
Attorney, Agent, or Firm—Blakely, Sokoloff, Taylor & Zafman

[57] ABSTRACT

Circuitry for discharging a drain of a cell of a non-volatile semiconductor memory is described. A discharge transistor is coupled between (1) the drain of the cell and (2) ground for selectably (a) providing a discharge paths to ground for the drain of the cell when the discharge transistor is enabled and (b) not providing a discharge path to ground for the drain of the cell when the discharge transistor is not enabled. Circuitry is coupled to the discharge transistor for enabling the discharge transistor for a duration that both begins and ends (1) after a first operation is performed with respect to the cell and (2) before a verify operation is performed with respect to the cell.

11 Claims, 13 Drawing Sheets

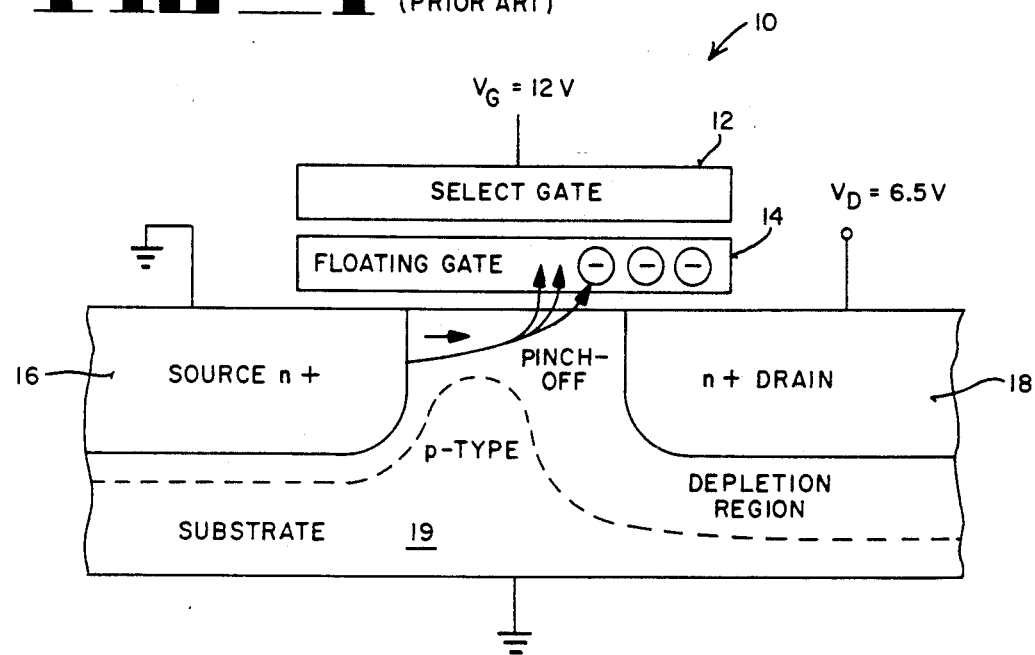
FIG_1 (PRIOR ART)
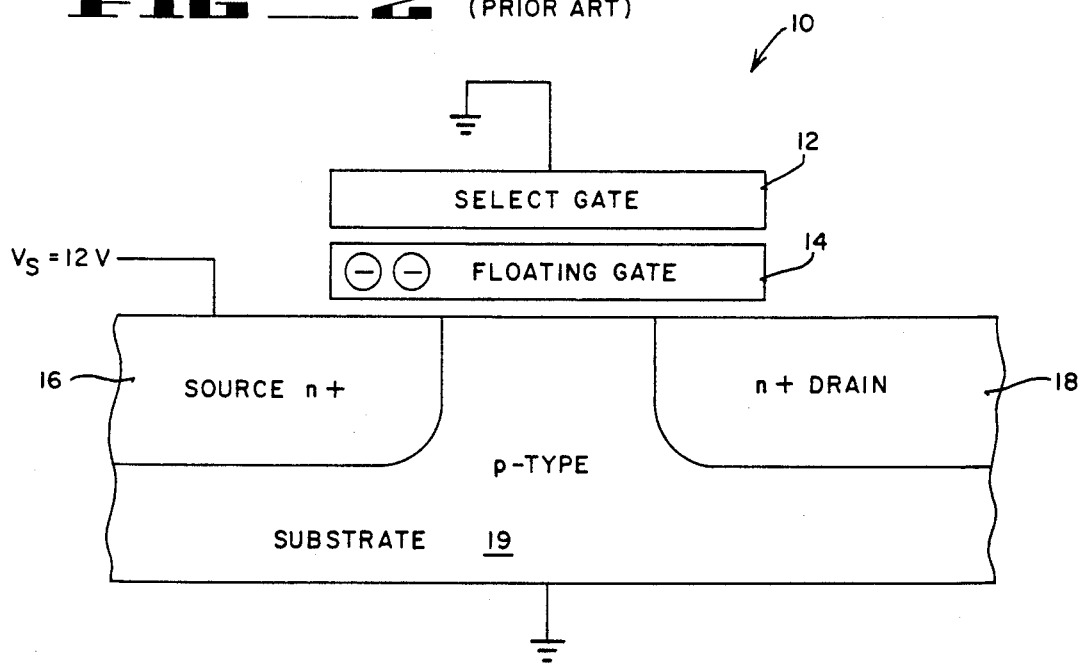
FIG_2 (PRIOR ART)

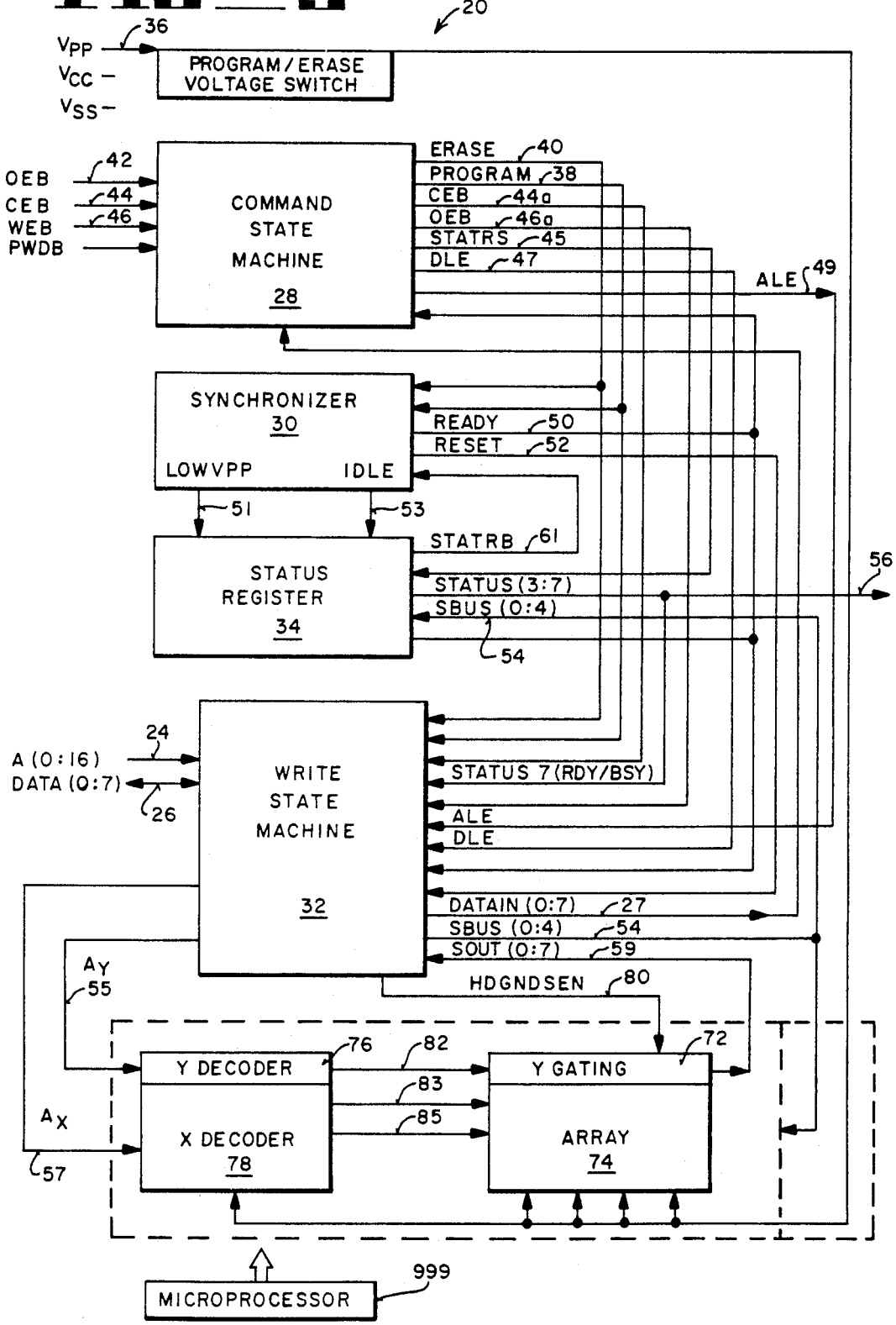

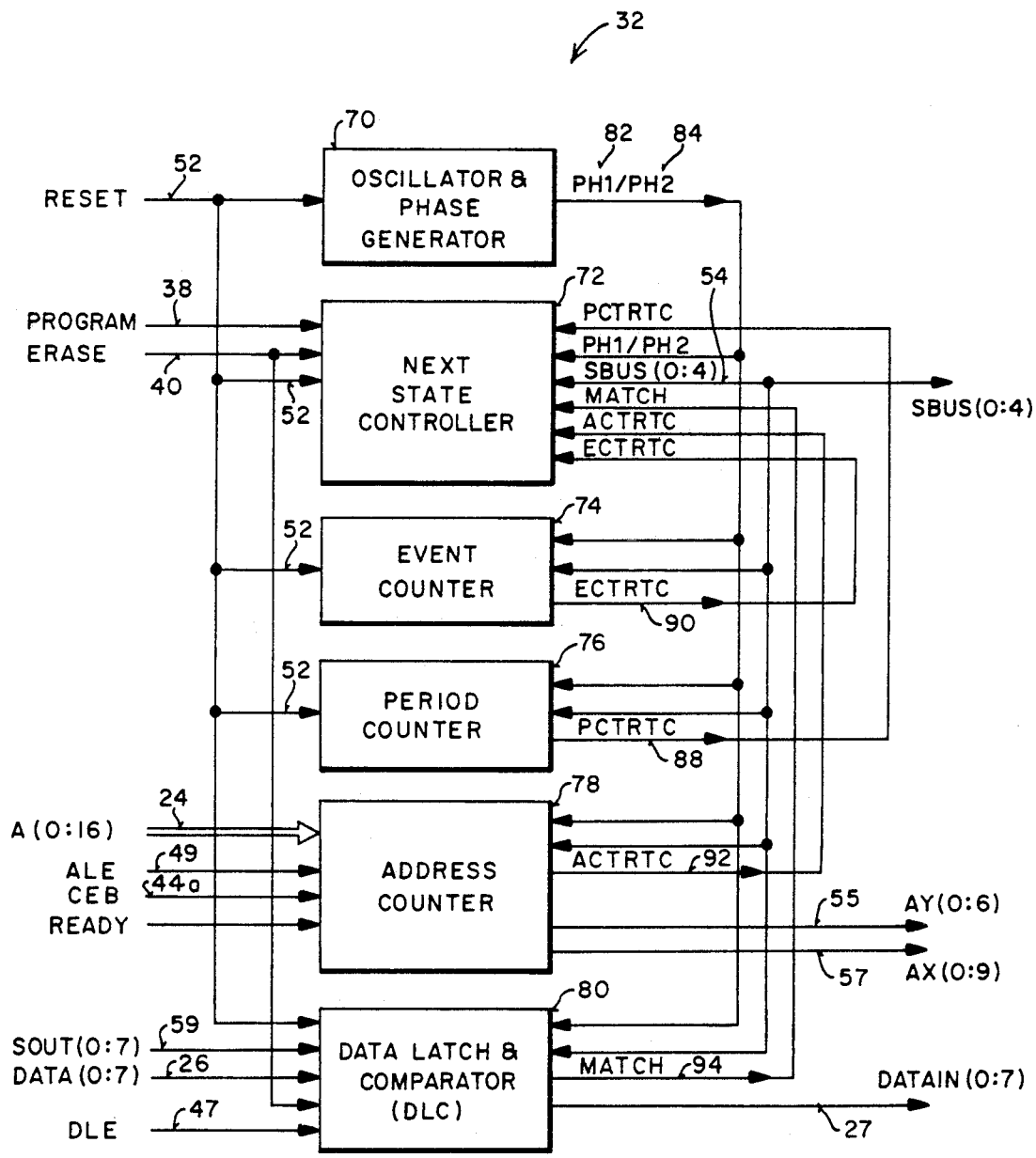

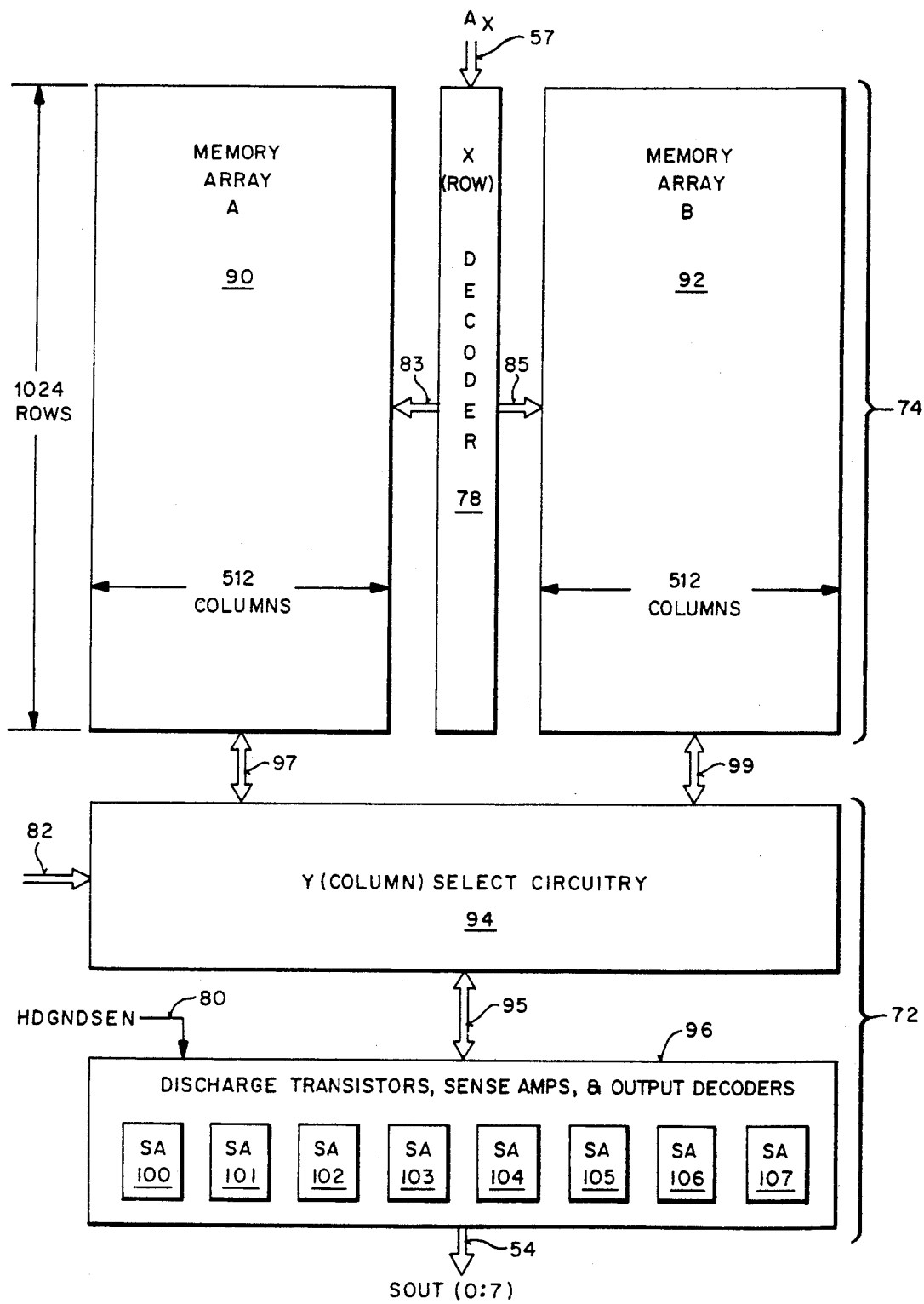

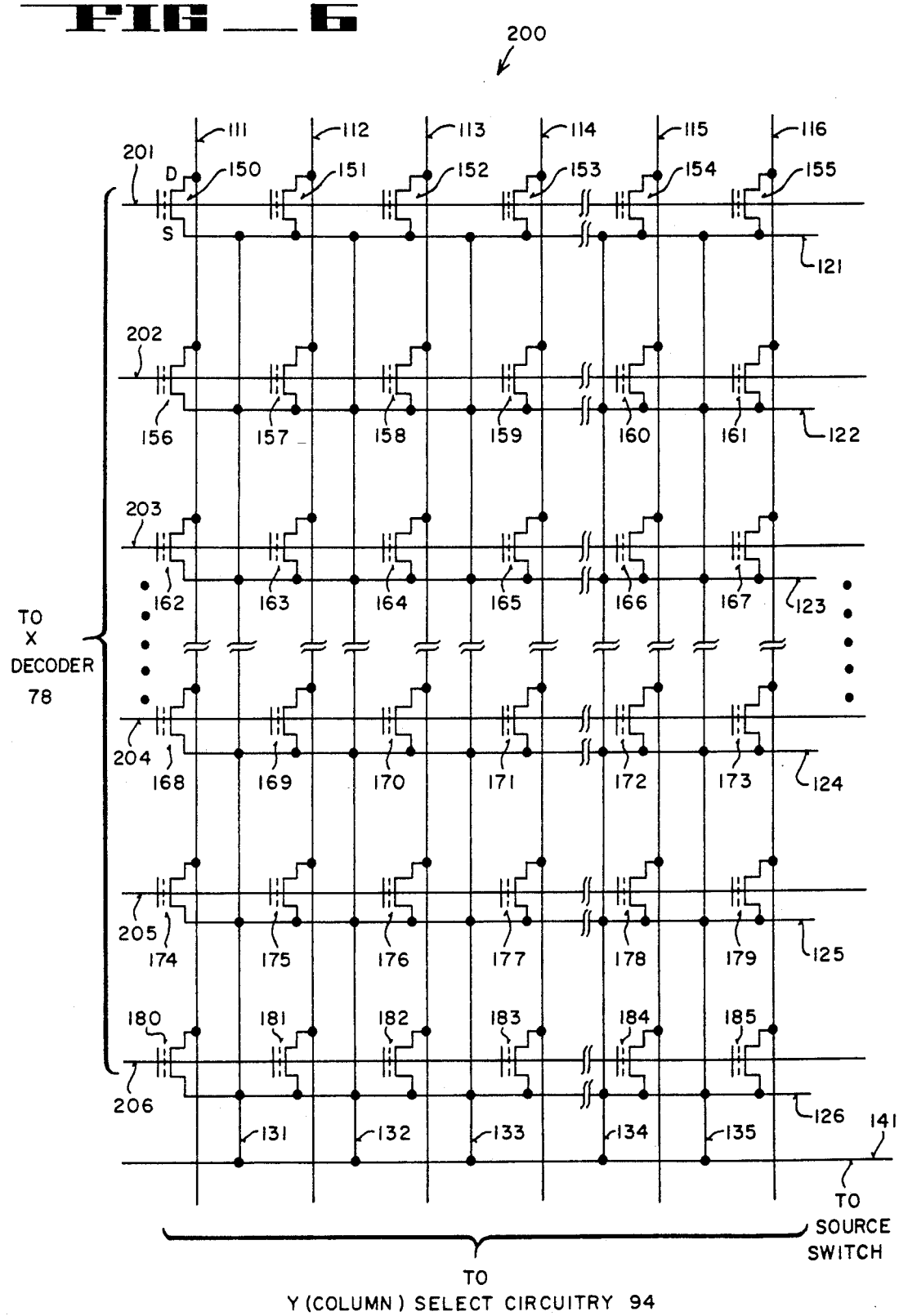

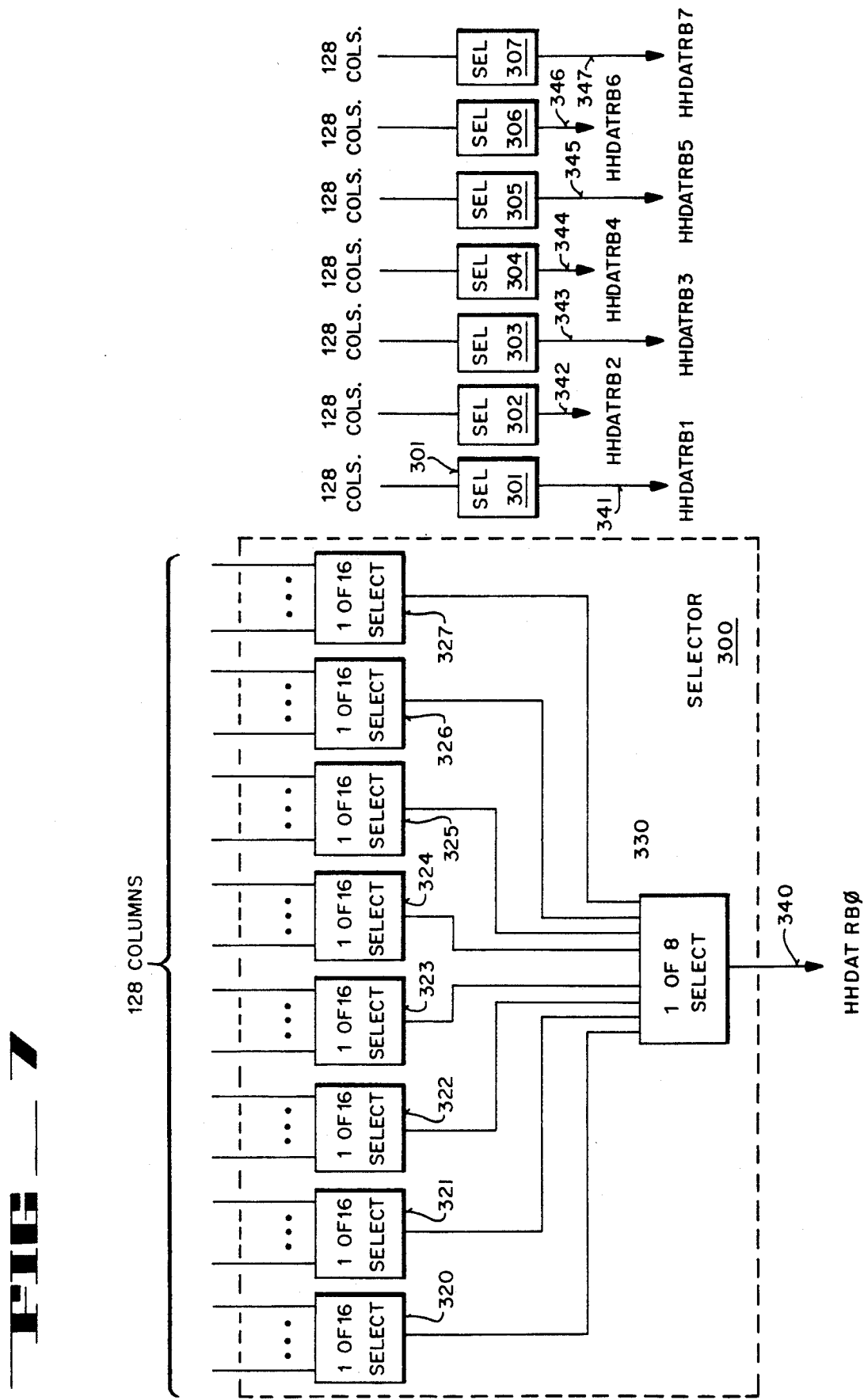

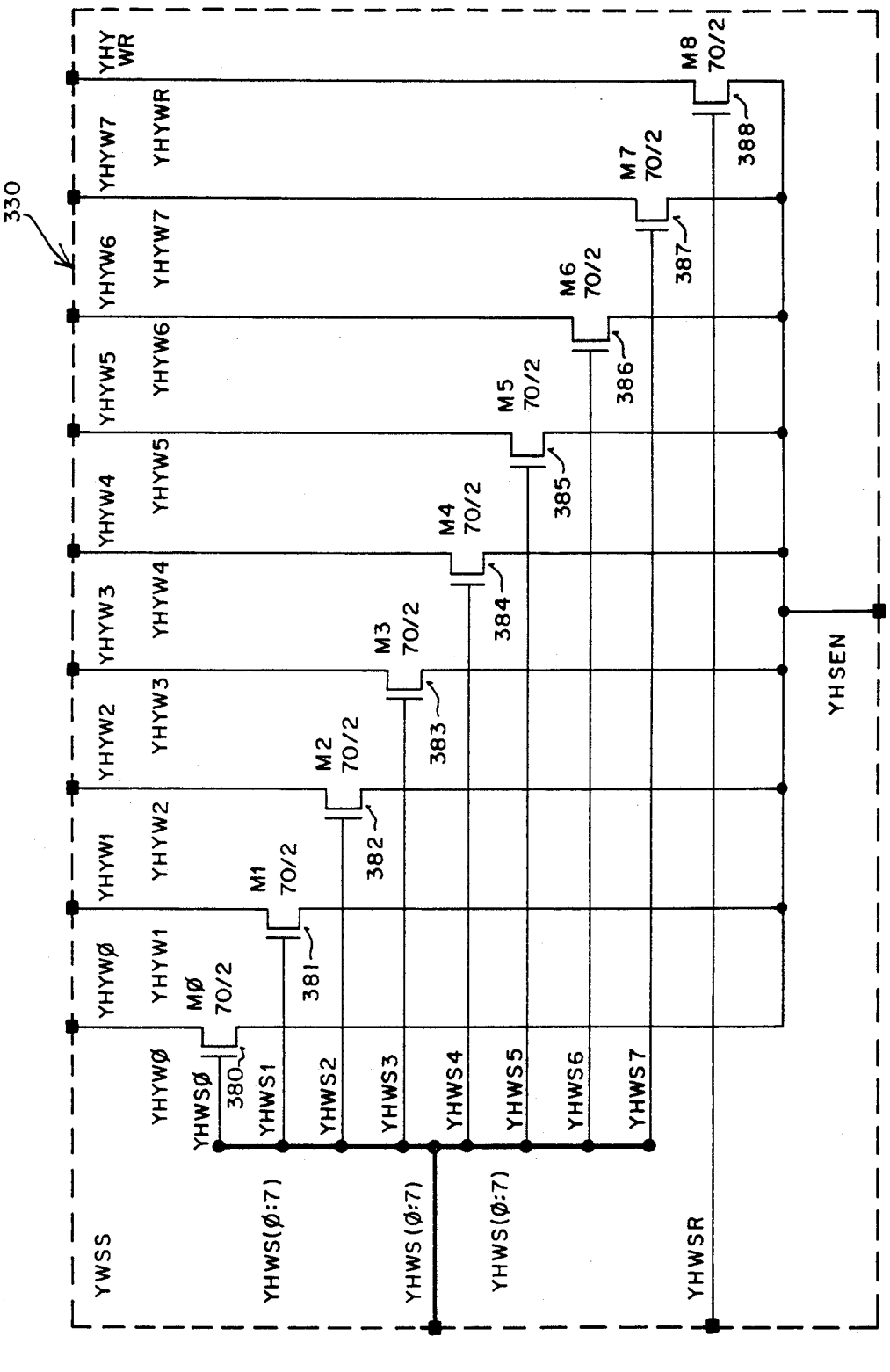
FIG—X

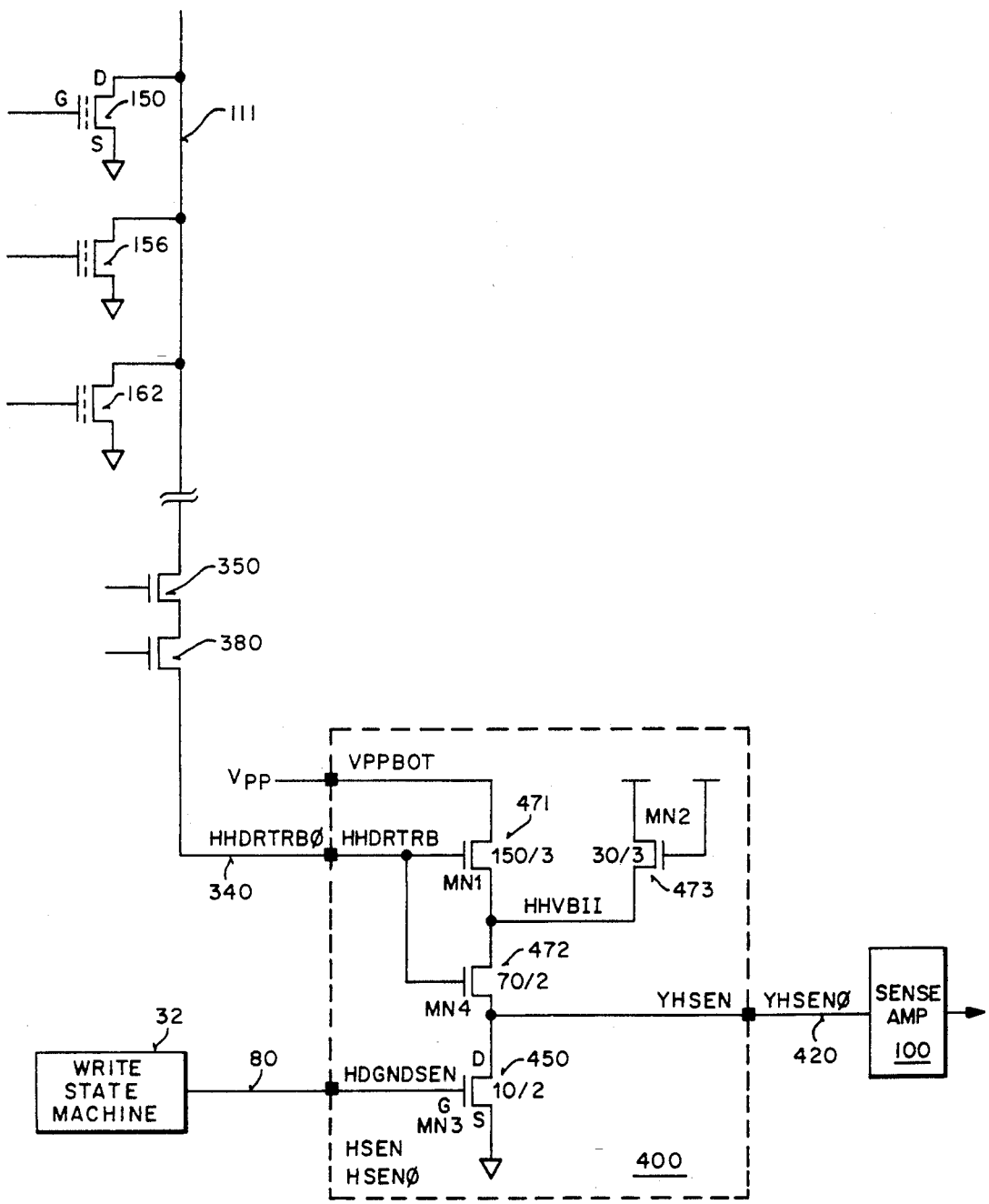
FIG_9

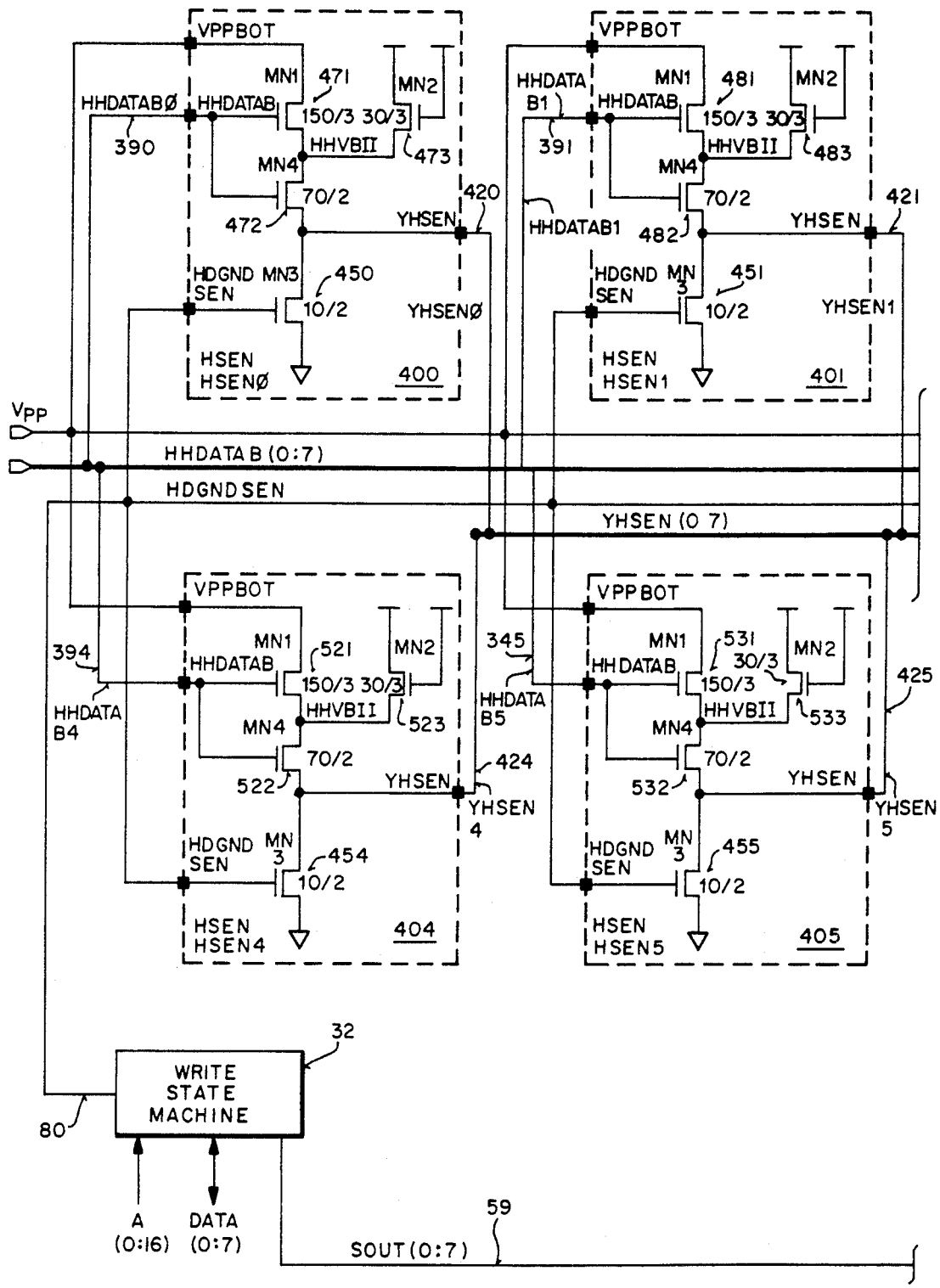

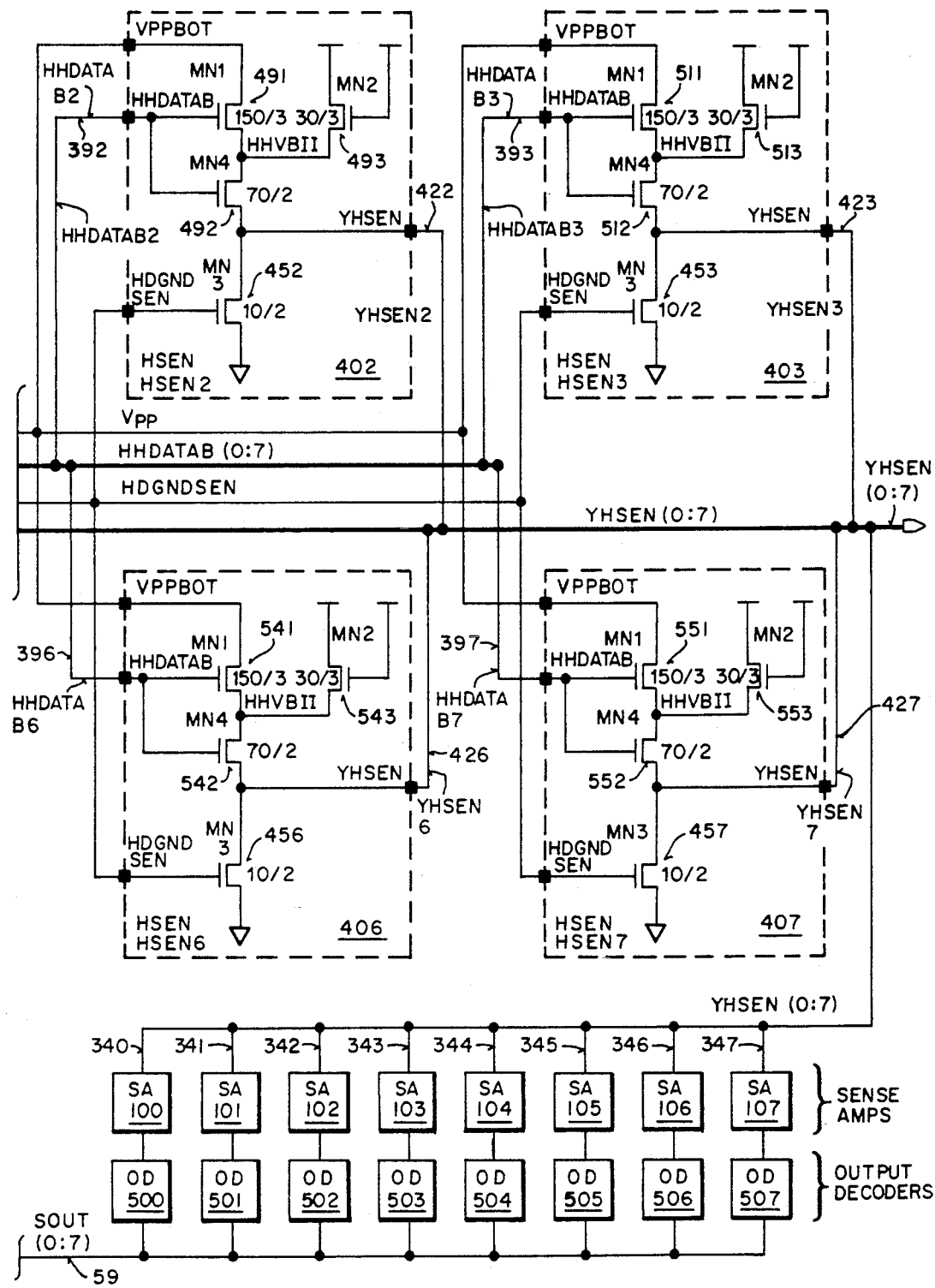

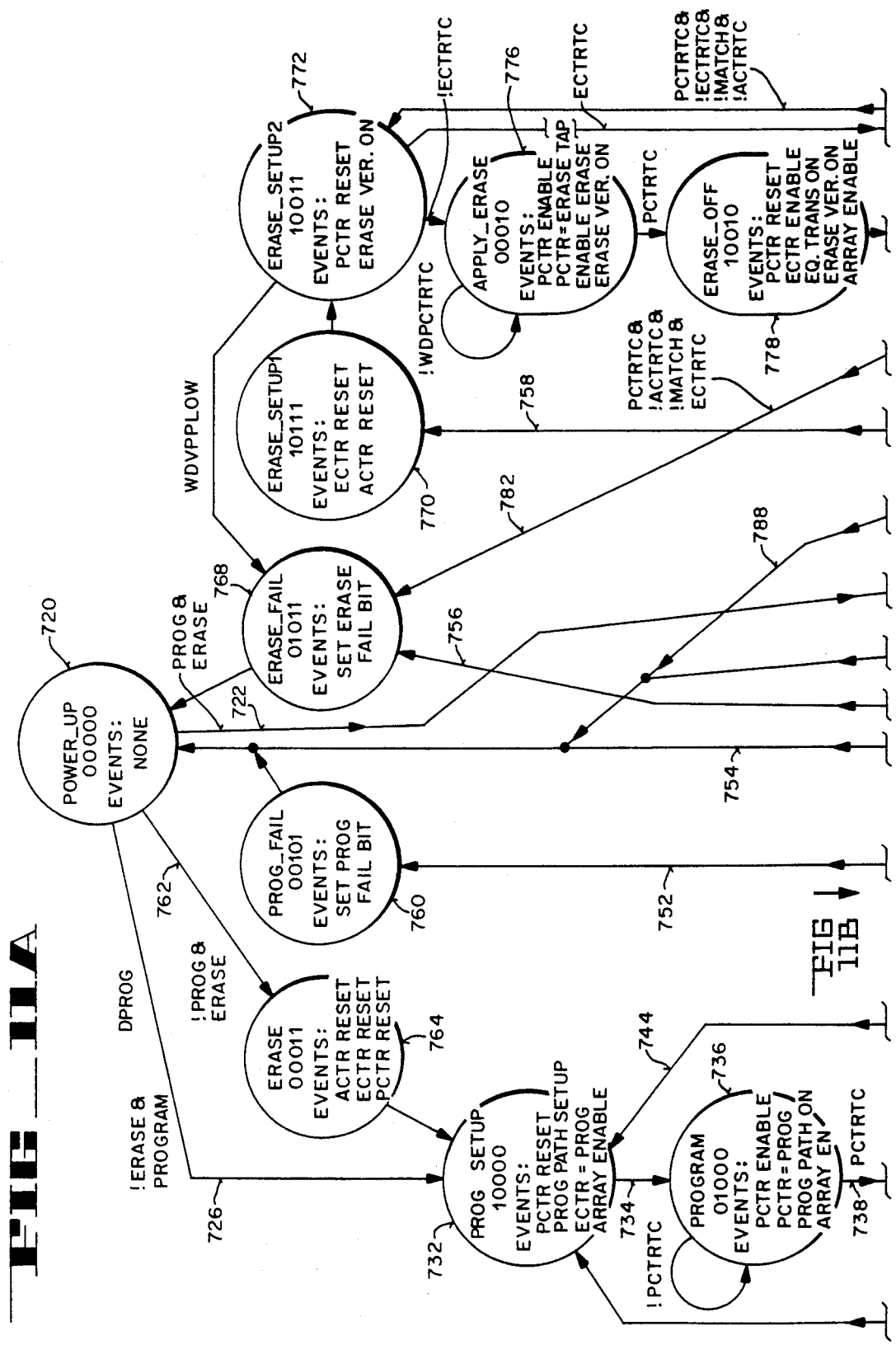

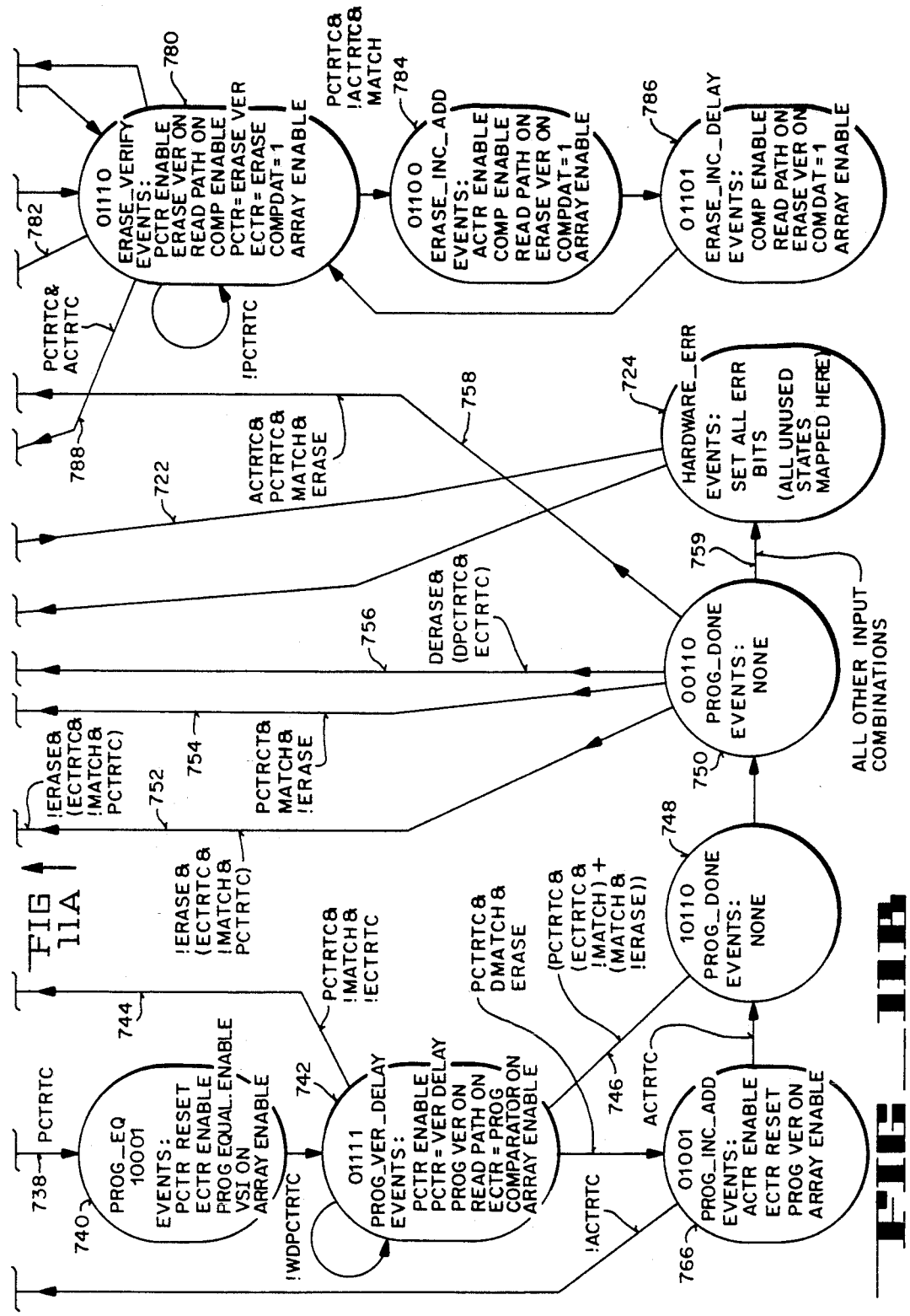

CIRCUITRY AND METHOD FOR DISCHARGING A DRAIN OF A CELL OF A NON-VOLATILE SEMICONDUCTOR MEMORY

FIELD OF THE INVENTION

The present invention relates to the field of nonvolatile semiconductor memories. More particularly, the present invention relates to circuitry for discharging a drain of a cell of a nonvolatile semiconductor memory and to programming and erasure sequences for the cell.

BACKGROUND

One type of prior non-volatile semiconductor memory is the flash electrically-erasable programmable read-only memory ("flash EEPROM"). The flash EEPROM can be programmed by a user, and once programmed, the flash EEPROM retains its data until erased. For certain prior flash EEPROMs, electrical erasure erases the entire memory array of the device. The flash EEPROM may then be programmed with new code.

One prior flash memory technology is the ETOX TM II technology of Intel Corporation of Santa Clara, Calif. FIG. 1 shows a prior ETOX TM II flash memory cell 10 of Intel Corporation. Prior flash memory cell 10 has a select gate 12, a floating gate 14, a source 16, and a drain 18. Source 16 and drain 18 reside within substrate 19. Substrate 19 is grounded. Flash memory cell 10 is comprised of a single transistor. Floating gate 14 is used for charge storage.

The field effect transistor ("FET") of flash memory cell 10 is turned on and off by the absence or presence of charge on floating gate 14 sitting above the conducting channel. Once excess electrons are placed on floating gate 14, the electrons are trapped there by the surrounding nonconducting oxide. The electric field the excess electrons produce will turn off the FET of memory cell 10, storing a logic 0 for the bit location represented by memory cell 10. When, however, no excess electrons are trapped on floating gate 14, the FET channel of memory cell 10 can conduct current and the cell 10 has a logic value of 1.

FIG. 1 shows a typical configuration of prior flash memory cell 10 for programming. A prior Quick-Pulse Programming TM algorithm of Intel Corporation is a type of prior algorithm that can be used as a microprocessor to program the flash memory. The programming mechanism for prior ETOX TM II flash memory cell 10 is hot electron injection. For programming, the drain 18 voltage $V_D$ is set to on the order of 6.5 volts and the gate 12 voltage $V_G$ is set to on the order of 12 volts. The source 16 of cell 10 is grounded.

The relatively high drain 18 program voltage on the order of 6.5 volts generates "hot" electrons that are swept across the channel of cell 10. These hot electrons collide with other atoms along the way, creating even more free electrons. Meanwhile, the relatively high voltage of approximately 12 volts on control gate 12 of cell 10 attracts these free electrons across the lower gate oxide into the floating gate 14, where those electrons are trapped. This programming process typically takes on the order of ten microseconds.

In the prior art, the program voltage is then disabled. The read circuits of the flash memory are enabled. For a prior art flash memory of Intel Corporation, there is then a delay of approximately six microseconds before a verify operation is performed.

This verify operation is a read operation with respect to the memory cells of the byte that has been programmed. For a verify operation, there should be on the order of one volt on drain 18, 7.2 volts on gate 12, and ground on source 16.

The six microsecond delay between the enablement of the read circuits and an actual verify operation allows time for drain 18 voltage $V_D$ to discharge from on the order of 6.5 volts (the programming voltage) to approximately 1.0 volts (the drain read voltage). The actual discharge time is a time that varies from device to device. The prior six microsecond delay was chosen to allow for variations from memory to memory in actual discharge times.

Once the six microsecond delay elapses, the addressed byte is read as part of the verify operation. Should the addressed byte require more time to reach the programmed state, the programming and verification operations are repeated until the byte is programmed.

Thus, the prior programming and verification operations for a prior Intel Corporation flash memory take at a minimum approximately 16 microseconds to complete—that is, 10 microseconds for programming plus a 6 microsecond delay before verification. Moreover, repetition of the programming and verification operations increases the amount of time required in multiples of 16 microseconds.

One disadvantage of the programming of that prior Intel flash memory is that the six microsecond delay before program verification slows down programming of the flash memory. If 128 Kilobits of the flash memory are being programmed, and if there is a six microsecond delay for each bit, then the total delay for programming the flash memory is approximately 0.786 seconds. Moreover, the six microsecond delay is a relatively conservative number that was chosen so as to cover variations in actual discharge time from memory to memory.

Quick-Erase TM algorithm of Intel Corporation is a type of prior algorithm that can be used by the microprocessor to erase the flash memory. The prior Quick-Erase TM algorithm requires that all bits of the memory first be programmed to their charged state, which is equivalent to data of 00 (hexidecimal). Erasure then proceeds by pulling the source of each transistor in the array up to a high voltage level for a period of 10 milliseconds, while keeping the transistor gates at zero volts. After each erase operation, verification is performed a byte at a time. For each byte during verification, the Quick-Erase TM algorithm allows up to approximately 3,000 full-array erase operations to be repeated before the algorithm generates an erase error signal. In other words, during verification, the algorithm steps through each byte at a time, repeating erasure if the byte has not yet been erased.

FIG. 2 shows a typical configuration of prior flash memory cell 10 for erasure. The erasure mechanism for prior ETOX TM II flash memory cell 10 is Fowler-Nordheim tunneling. For erasure, the gate 12 is grounded, the source 16 voltage Vs is set to 12 volts, and the drain 18 is left disconnected and, hence, floating. Typically the floating drain 18 charges up to an uncharacterized level.

During erasure, a high electric field is thus created between source 16 (at 12 volts) and floating gate 14 (at ground). This high electric field pulls electrons off floating gate 14. The erasure operation typically takes approximately 10 milliseconds.

In the prior art, the erasure voltage of 12 volts on the source is then disabled. The read circuits of the flash memory are enabled. For a prior art flash memory of Intel Corporation, there is then a delay of approximately six microseconds before a verify operation is performed with respect to a byte. For the verify operation, there should be on the order of one volt on drain 18, 3 volts on gate 12, and ground on source 16.

The six microsecond delay allows time for the floating drain 18 to discharge from its floating voltage (typically 3 to 6 volts) to the 1.0 volt drain 18 read voltage.

Once the 6 microsecond delay elapses, one byte of memory cells is read as part of the verify operation. If the addressed byte has not yet been erased, then erasure and verification operations are repeated until the algorithm determines that either the byte has been erased or enough erase cycles are performed to generate an erase error condition. The algorithm then steps to the next byte and performs a similar verification operation with respect to that byte. The algorithm eventually steps through all the bytes to be erased.

Thus, certain prior erasure and verification operations require a 6 microsecond delay for each iteration of the verification operation for each byte being erased up to approximately 3,000 iterations per byte are possible for the prior Quick-Erase TM algorithm.

One disadvantage of the erasure of the prior Intel flash memory is that the six microsecond delay per erasure verification iteration per byte shows down the erasure of the flash memory. Moreover, the six microsecond delay is a relatively conservative delay that was chosen to cover variations in actual discharge time that from memory to memory.

SUMMARY AND OBJECTS OF THE INVENTION

One of the objects of the present invention is to minimize the delay between the programming of a cell of a nonvolatile semiconductor memory and the reading of the cell.

Another of the objects of the present invention is to minimize the delay between the erasure of a cell of a nonvolatile semiconductor memory and the reading of the cell.

Another of the objects of the present invention is to provide circuitry for discharging a drain of a cell of a nonvolatile semiconductor memory.

Circuitry for discharging a drain of a cell of a non-volatile semiconductor memory is described. A discharge transistor is coupled between (1) the drain of the cell and (2) ground for selectably (a) providing a discharge path to ground for the drain of the cell when the discharge transistor is enabled and (b) not providing a discharge path to ground for the drain of the cell when the discharge transistor is not enabled.

A programming sequence for a cell of a non-volatile memory is also described. A first voltage is applied to a drain of the cell, a second voltage is applied to a gate of the cell, and ground is applied to a source of the cell for programming the cell. The application of the first and second voltages is disabled. The drain of the cell is shorted to ground. The shorting of the drain of the cell to ground is disabled. A read operation with respect to the cell is performed in order to verify programming of the cell.

An erasure sequence for a cell of a non-volatile semiconductor memory is described. A first voltage is applied to a source of the cell, a second voltage is applied to a gate of the cell, and a drain of the cell is allowed to float for erasing the cell. The application of the first voltage to the source of the cell is disabled, and the application of the second voltage to the gate of the cell is disabled. The source of the cell is shorted to ground. The drain of the cell is shorted to ground. The shorting of the drain of the cell to ground is disabled. A read operation with respect to the cell is performed in order to verify erasure of the cell.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 1 is a cross-sectional illustration of one prior art flash memory cell being programmed.

FIG. 2 is a cross-sectional illustration of the prior art flash memory cell being erased.

FIG. 3 is a block diagram of circuitry of a flash memory, including a memory array.

FIG. 4 is a block diagram of a write state machine.

FIG. 5 is a block diagram of the layout of the flash memory.

FIG. 6 is an electrical schematic of a portion of the flash memory array.

FIG. 7 illustrates column selects of the flash memory.

FIGS. 8A and 8B show an electrical schematic of a one of sixteen column selector and of a one of eight selector.

FIG. 9 illustrates certain flash memory array cells that are coupled to a discharge transistor.

FIGS. 10A and 10B illustrate eight discharge transistors coupled to sense amplifiers and output decoders.

FIGS. 11A and 11B show the steps for programming, erasing, and verifying the flash memory array.

DETAILED DESCRIPTION

Figure 8A:
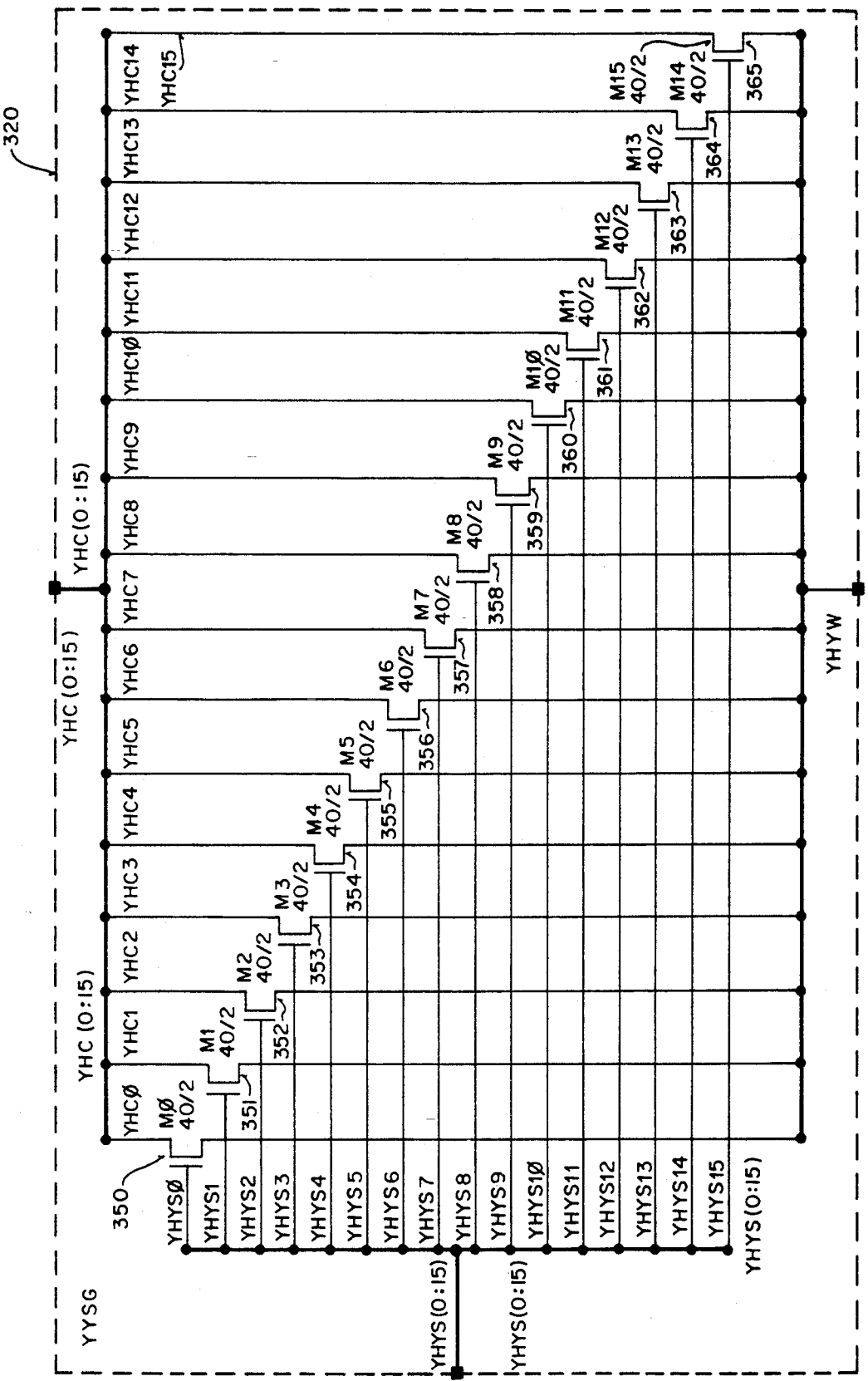

FIG. 3 illustrates in block diagram form the circuitry of flash EEPROM 20, which is one type of semiconductor memory. Flash EEPROM 20 is also referred to as flash memory 20.

Flash memory 20 includes a memory array 74, which includes flash memory cells that store data at addresses. Flash memory 20 also includes on-chip command state machine ("CSM") 28, synchronizer 30, write state machine ("WSM") 32, and status register 34.

As described in more detail below, flash EEPROM 20 includes Y gating circuitry 72, which includes column selectors, discharge transistors, sense amplifiers, and output decoders. The discharge transistors are also referred to as equalization transistors. The discharge transistors of Y gating circuitry 72 are coupled to the drains of flash memory cells within memory array 74. The discharge transistors are controlled by write state machine 32 via the HDGNDSEN signal. The discharge transistors are used to short the drains of certain flash memory cells to ground for a period of time on the order of 0.5 microseconds between the programming of memory cells and the reading of memory cells. The discharge transistors are also used to short the drains of certain memory cells to ground for a period of time on the order of 0.5 microseconds between the erasing of certain flash memory cells and the reading of certain flash memory cells. The discharge transistors thereby minimize the time between programming flash memory cells and reading flash memory cells. The discharge transistors also minimize the time between erasing flash memory cells and reading flash memory cells.

Vpp 36 is the erase/program power supply voltage for flash memory 20. Vcc is the device power supply for flash memory 20. Vss is ground in one embodiment of the present invention. In one embodiment, Vpp 36 is 12.0 volts and Vcc is approximately 5 volts.

In the absence of high voltage on Vpp 36, flash memory 20 acts as a read-only memory. The data stored at an address supplied via lines 24 is read from memory array 74 and made available via data lines 26 to circuitry external to flash memory 20.

Input chip enable bar CEB 46 is a power control that is used to select flash memory 20. CEB 46 is active low. Output enable bar input OEB 42 is an output control for flash memory 20. OEB 42 is used to gate data from the output bins for flash memory 20. OEB 42 is active low. Both control signals CEB 46 and OEB 42 must be logically active to obtain data at data lines 26 of flash memory 20.

Write enable bar signal WEB 44 allows data to be written to memory array 74 while CEB 46 is low. Write enable bar signal 44 is active low. Addresses and data are latched on the falling edge of WEB 44. Standard microprocessor timings are used.

Device operations are selected by writing specific data patterns into flash memory 20 via data input lines 26.

Memory array 74 is divided into blocks of cells. Erasure is executed on at least one block of memory array 74 and is initiated by a two cycle command sequence. An erase set up command is first written, followed by an erase confirm command. These commands require both appropriate command data and an address within memory array 74. This two step erasure helps to ensure that memory contents are not accidently erased. Erasure can occur only when high voltage is applied to Vpp. In the absence of this high voltage, the memory contents are protected against erasure.

Erasure involves two major tasks: preconditioning and erasing. Preconditioning entails programming each byte of a block of memory to the charged state, which is equivalent to data of 00 (hexadecimal). Erasure also involves verification. Memory preconditioning, erasure, and margining are all handled internally by write state machine 32. Polling status register 34 with a status register read command will determine whether the erasure sequence is complete.

Programming is controlled by a two cycle command sequence. A program set-up command is written to command state machine 28 via data lines 26, followed by a second write command specifying the address and data to be programmed. Write state machine 32 then takes over and controls the program and verify algorithms internally. Polling status register 34 with a status register read command will determine whether the programming sequence is complete.

In a preferred embodiment, the circuitry shown in FIG. 3 of flash memory 20 is on a single substrate. In a preferred embodiment, flash memory 20 uses complementary metal oxide semiconductor ("CMOS") circuitry.

Commands to program and erase flash memory 74 are applied via data lines 26. The data on data lines 26 is past to command state machine 28. Command state machine 28 then decodes the data. If the data represents an erase command, a program command, or a status register reset command, the command state machine 28 begins generating the appropriate control signals. Those control signals are then sent to write state machine 32. The control signals provided by command state machine 28 to write state machine 32 include PROGRAM 38, ERASE 40, status register reset signal STATRS 45, and data latch enable signal DLE 47.

Write state machine 32 steps flash memory 20 through multistep sequences to program or erase flash memory contents as desired, upon an initiating command from microprocessor 999. Once a program for erasure sequence is initiated, write state machine 32 controls programming, erasure, verification, and internal margining. Status register 34 indicates to microprocessor 999 the point at which program and erasure operations have been completed.

As shown in FIG. 4, write state machine 32 includes an oscillator and phase generator, a next state controller, an event counter, a period counter, an address counter, and data latch and comparator circuitry. Write state machine 32 is made up of registers, latches, logic circuits, and a programmable logic array. Write state machine 32 is configured to step through multistep program and erasure sequences that are described in more detail below, especially in connection with FIGS. 11A and 11B.

Write state machine 32 latches addresses from inputs A[0:16] 24 in data from inputs D[0:7] 26 for erasure, program, and read/verification operations. Write state machine 32 also outputs data on lines D[0:7] 26 via data latches. Write state machine 32 uses address latches for addresses and data latches for data. The address latches and data latches of write machine 32 are controlled respectively by address latch enable signal ALE 49 and data latch enable signal DLE 47 received from command state machine 28.

Write state machine 32 is coupled to Y decoder 76 via lines AY 55. Write state machine 32 is coupled to X decoder 78 via lines AX 57. Y decoder 76 is a column decoder for flash memory array 74. X decoder 78 is a row decoder for flash memory array 74.

Y gating circuitry 72 is of FIG. 3 used to read data or program code from flash memory array 74. Y gating circuitry 72 includes Y(column) selects, discharge transistors, sense amplifiers, and output decoders. Data that is sensed by Y gating circuitry 72 is sent to write state machine 32 via lines SOUT[0:7] 59. Write state machine 32 sends control signal HDGNDSEN to the discharge transistors of Y gating circuitry 72 via lines 80.

Write state machine 32 reports its status during operation to synchronizer 32 and status register 34 via SBUS[0:4] outputs 54.

Synchronizer 30 provides synchronization between write state machine 32 and command state machine 28.

Status register 34 decodes the SBUS [0:4] outputs 54 and indicates to microprocessor 999 whether a particular task is complete or not and its success via STATUS outputs 56.

FIG. 5 further illustrates memory array 74, Y gating circuitry 72, and row (X) decoder 78. FIG. 5 also illustrates column selects 94.

As shown in FIG. 5, flash memory array 74 is physically divided into two memory arrays—namely, flash memory array A 90 and flash memory array B 92.

In the embodiment shown in FIG. 5, flash memory array 74 stores 1,048,576 bits (i.e., 1 megabit of information). For that embodiment, flash memory array 90 and flash memory array 92 each have 1,024 rows and 512 columns of flash memory cells.

In alternative embodiments, flash memory array 74 can be larger or smaller. For example, in one alternative embodiment, flash memory array can comprise four megabits. In other alternative embodiment, for example, flash memory array 74 can comprise 256 kilobits.

As shown in FIG. 5, row decoder 78 (also referred to as X decoder 78) is coupled to memory arrays 90 and 92. Row decoder 78 is coupled to address lines 57. Row decoder 78 selects one of the 1,024 rows of memory arrays 90 and 92 based on the address appearing on lines 57.

Circuitry 96 and Y (column) select circuitry 94 is part of Y gating circuitry 72. Circuitry 96 includes discharge transistors, sense amplifiers and output decoders. Circuitry 96 includes eight sense amplifiers, which are sense amplifiers 100 through 107.

Y gating circuitry 72 provides an output SOUT[0:7] on lines 59, which is applied to write state machine 32. The data that appears on lines 59 is the data read from memory arrays 90 and 92. That data is read from flash memory array 74 by supplying addresses on lines 55 and 57. The addresses on lines 55 and 57 are decoded by Y decoder 76 and X decoder 78 respectively.

Y decoder 76 decodes the Y portion of the address on lines 55. Y decoder 76 decodes the binary address on lines 55 and then sends signals on lines 82 to the Y column selects circuitry 94. The Y column selects circuitry 94 then selects the physical columns within memory arrays 90 and 92 that are to be coupled to circuitry 96, which includes sense amplifiers 100 through 107.

X decoder circuitry 78 decodes the X portion of the address appearing on lines 57. The output of X decoder 78 is applied to the rows of memory arrays 90 and 62 via lines 83 and 85. X decoder 78 is used to decode the binary portion of the address to the particular physical row to be selected and read from or written to.

FIG. 6 illustrates portion 200 of flash memory array 90. Portion 200 of flash memory array 90 includes individual flash memory cells 150 through 185, which are each a field effect transistor. Each of the cells 150 through 185 has a drain, a source, and a gate.

Lines 201 through 206 are word lines that extend throughout flash memory arrays 90 and 92. Word lines 201 through 206 are also referred to as X lines. Each of th word lines 201 through 206 is coupled to the gates of those memory cells that are in a particular row. For example, word line 201 is coupled to the gates of memory cells 150 through 155. Word lines 201 through 206 are coupled to X decoder 78. Word lines 201 through 206 are also referred to as row lines.

Common source line 141 is the common source line for memory array 90. Common source line 141 is coupled to a source switch that regulates the amount of voltage applied to the sources of the memory cells 150 through 185. First and second local sources lines 121 through 126 and 131 through 135 are coupled to common source line 141. Each of the first local source lines 121 through 126 are coupled to a particular row of the flash memory array. Each of the second local source lines 131 through 135 are coupled to a particular column of the array of flash memory cells. Common source lne 141 and first and second local source lines 121 through 126 and 131 through 135 are coupled to the sources of memory cells and provide a path for applying voltages to the sources of those memory cells.

Bit lines 111 through 116 are coupled to the drains of flash memory cells 150 through 185. Bit lines 111 through 116 are also referred to as column lines or Y lines. Each of the respective column lines 111 through 116 is coupled to a particular column of flash memory cells. For example, bit line 111 is coupled to the drains of flash memory cells 150, 156, 162, 168, 174, and 180.

Bit lines 111 through 116 are coupled to Y select circuitry 94.

Referring to FIG. 5, Y select circuitry 94 receives signals from Y decoder 76 via lines 82. Based on the input 82, Y select circuitry 94 selects which of the columns of flash memory cells of memory array 74 are to be programmed or read from.

Column select circuitry 94 couples the particular columns to be programmed or read from to circuitry 96 via lines 95. Column select circuitry 94 is comprised of selector circuitry, which is also referred to as decoder circuitry. The 512 columns of memory array 90 are coupled to column select circuitry 94 via lines 97. The 512 columns of flash memory array 92 are coupled to column select circuitry 94 via lines 99. Column select circuitry 94 selects eight columns of the collective 1,024 columns of flash memory array 74 and couples those eight columns to circuitry 96 via lines 95.

FIGS. 7, 8A, and 8B illustrate the selectors of column select circuitry 94. FIG. 7 shows eight selectors 300 through 307. Selectors 300 through 307 can pass signals or data in both directions. Each of the selectors 300 through 307 has a line coupled to 128 columns of flash memory array 74. In one embodiment of the present invention, each of those 128 columns can be scattered throughout flash memory array 74. In that embodiment, for example, several of the 128 columns can be found in flash memory array 90, with the rest of the 128 columns scattered through flash memory array 92.

FIG. 7 illustrates the contents of selector 300. Selector 300 includes one of sixteen selectors 320 through 327. Selectors 320 through 327 are coupled at one end to 128 columns of flash memory array 74. Selectors 320 through 327 are coupled at the other end to one-of-eight selector 330. At one end of one-of-eight selector 330 is the signal YHSEN0. The signal YHSEN0 resides on lines 95 of FIG. 5 and is coupled to circuitry 96.

Each of the selectors 320 through 327 have sixteen lines at one side and one line at the other side.

FIG. 8A further shows the schematic of one-of-sixteen selector 320. Selector 320 includes transistors 350 through 365. Transistors 350 through 365 are used to select one line out of sixteen lines.

FIG. 8B shows a schematic of selector 330. Selector 330 includes transistors 380 through 388. Transistors 380 through 388 are used to select one line from eight lines.

Selectors 301 through 307 shown in FIG. 7 are configured similarly to selector 300. Selectors 301 through 307 each have 128 columns coupled to one side. Selectors 301 through 307 have signals YHSEN1 through YHSEN7 at the other side. Those YHSEN signals reside on lines 95 coupled to circuitry 96 of FIG. 5.

FIG. 9 shows discharge transistor 450, which is used to minimize the time between the programming of the flash memory cells of flash memory array 74 and the verification of the flash memory cells of flash memory array 74. Discharge transistor 450 also helps to minimize the time between the erasing of the cells of flash memory erase 74 and the verification (i.e., reading) of the cells of flash memory array 74. Discharge transistor 450 is also referred to as equalization transistor 450. Discharge transistor 450 is a grounding transistor.

The gate of discharge transistor 450 is coupled to write state machine 32 of flash memory 20 via line 80. Write state machine 32 sends out HDGNDSEN signal to the gate of discharge transistor 450 on line 80. The HDGNDSEN signal sent from write state machine 32 turns discharge transistor 450 on and off. The source of discharge transistor 450 is grounded. In one embodiment of the present invention, discharge transistor 450 is a CMOS field effect transistor.

The drain of discharge transistor 450 is coupled to sense amplifier 100 via line 340. The drain of discharge transistor 450 is also coupled to pull-up transistors 471, 472, and 473. The drain and gate of pull-up transistor 473 is coupled to 5 volts. The drain of pull-up transistor 471 is coupled to Vpp. The gates of pull-up transistors 471 and 472 are tied together and coupled to line 390 and signal HHDATAB∅.

The HHDATAB signals, including HHDATAB∅, are used to program the cells of flash memory array 74. During programming, HHDATAB∅ becomes logical high, which in turn turns on transistors 471 and 472. Turning on transistors 471 and 472 means that voltage Vpp is applied to line 340 and YHSEN∅ takes on the value of Vpp, which is approximately 12 volts. If transistors 350 and 380 are turned on, then the 12 volts on line 340 is applied to the drains of the flash cells on bit line 111, including cells 150, 156, and 162. When that happens, each cell on bit line 111 having its gate voltage at approximately 12 volts is programmed.

Line 340 contains signal YHSEN∅. Line 340 is coupled to (1) the drain of discharge transistor 450, (2) sense amplifier 100, and (3) the source of transistor 380. Thus, as shown in FIG. 9, the drain of discharge transistor 450 is coupled to the source of transistor 380.

Transistor 380 is one of the selection transistors out of the one-of-eight selector 330 of selector 300 of the column select circuitry 94. The drain of transistor 380 is coupled to source of transistor 350. Transistor 350 is one of the selection transistors within the one of sixteen selector 320 of selector 300 of column selector circuitry 94 of Y gating circuitry 72.

The drain of selection transistor 350 is in turn coupled to bit line 111 of flash memory array 74. Flash memory cells 150, 156, and 162 of flash memory array 74 are shown coupled to bit line 111 in FIG. 9.

The schematic shown in FIG. 9 is an example of one of the columns of cells of flash memory array 74 being coupled to discharge transistor 450. For the example shown in FIG. 9, column select circuitry 94 received a signal from Y decoder 76 via lines 82 to select that particular bit line 111 for discharge transistor 450. For a different pattern of data AY received by Y decoder 76, column select circuitry 94 would select a different bit line within flash memory array 74 to couple to discharge transistor 450. In addition, FIG. 9 only illustrates some of the flash memory cells coupled to bit line 111. Flash memory array 74 in fact has 1,024 memory cells coupled to each bit line.

FIGS. 10A and 10B show that discharge transistor 450 is only one of eight discharge transistors of circuitry 96 of Y gating circuitry 72 of flash memory 20. FIG. 10 shows discharge transistors 450 through 457. Discharge transistor 400 is part of circuitry 420 that includes pull-up transistors 471 through 473.

One input to circuitry 400 is voltage Vpp of flash memory 20. Another input to circuitry 400 is the HDGNDSEN signal sent from write state machine 32 via line 80. Another input to circuitry 400 is the HHDATAB∅ signal via line 390. As described above, the HHDATAB∅ signal is used for programming the flash memory cells.

Line 340 carrying the YHSEN∅ signal is coupled to the drain of discharge transistor 450. Line 340 is also coupled to (1) selector 300 of column select circuitry 94 and (2) sense amplifier 100.

When an HDGNDSEN pulse is received by discharge or grounding transistor 450 via line 80, then the drain of transistor 450 is shorted to ground. This in turn shorts line 340 to ground, which shorts the drains of the memory cells in the selected column to ground via selector 300. The HDGNDSEN pulse is received from write state machine 32.

Line 340 is coupled to the input of sense amplifier 100. The output of sense amplifier is coupled to the input of output decoder 500. The output of output decoder 500 is coupled to write state machine 32 via SOUT[0:7] lines 59.

FIG. 10B shows that there are eight sense amplifiers within circuitry 96 of Y gating circuitry 72. Those sense amplifiers are sense amplifiers 100 through 107. Sense amplifiers 100 through 107 are each respectively coupled to output decoders 500 through 507. The output of output decoders 500 and 507 are coupled to write state machine 32 via lines SOUT[0:7] 59.

As shown in FIG. 10A, circuitry 401 includes discharge transistor 451 and pull-up transistors 481 through 483. Circuitry 401 receives the same HDGNDSEN signal and Vpp voltage as inputs as does circuitry 400. Another input to circuitry 401 is the HHDATAB1 signal. The HHDATAB1 signal is one of the HHDATAB signals containing data to be programmed into the cells of flash memory array 74.

Line 341 carrying the YHSEN1 signal is coupled to the drain of discharge transistor 451. Line 341 is also coupled to (1) selector 301 of column select circuitry 94 and (2) sense amplifier 101.

The voltage Vpp is also applied as an input to each of the circuits 402 through 407. The signal HDGNDSEN from write state machine 32 is also applied as an input to circuitry 402 through 407 via line 80.

Circuit 402 includes discharge transistor 452 and pull-up transistors 491 through 493. Circuitry 403 includes discharge transistor 453 and pull-up transistors 511 through 513. Circuitry 404 includes discharge transistor 454 and pull-up transistors 521 through 523. Circuitry 405 includes discharge transistor 455 and pull-up transistors 531 through 533. Circuitry 406 includes discharge transistor 456 and pull-up transistors 541 through 543. Circuitry 407 includes discharge transistor 457 and pull-up transistors 551 through 553.

A YHSEN2 signal with respect to circuitry 402 is coupled to selector 302 and to sense amp 102 via line 342. A YHSEN3 signal with respect to circuitry 403 is coupled to selector 303 and to sense amplifier 103 via line 343. A YHSEN4 signal with respect to circuitry 404 is coupled to selector 304 and to sense amplifier 104 via line 344. A YHSEN5 signal with respect to circuitry 405 is coupled to selector 305 and to sense amplifier 105 via line 345. A YHSEN6 signal with respect to circuitry 406 is coupled to selector 306 and to sense amplifier 106 via line 346. A YHSEN7 signal with respect to circuitry 407 is coupled to selector 307 and to sense amplifier 107 via line 347.

It is to be appreciated that each of the gates of discharge transistors 450 through 457 are coupled together and also coupled to line 80, which in turn is coupled to write state machine 32. The gates of discharge transistors 450 through 457 are coupled together because flash memory 20 is a byte write memory. The fact that flash memory 20 is a byte write memory means that eight bits are written together at a time. This gives flash memory 20 a high degree of parallelism.

With reference to FIGS. 3, 4, 5, 9, 10A, 10B, 11A, and 11B, the operation of discharge transistors 450 through 457 is described. In FIGS. 11A and 11B, each bubble represents a state of write state machine 32. The name of each state is indicated on the top line of each bubble. The unique SBUS [0:4] 54 value for each state is indicated below the state name. The signals that are selected or enabled during each state are listed below the SBUS values.

The combination of signals that cause the next state controller of write state machine 32 to branch to another state are generally indicated in text beside each branch with inactive signals proceeding by an exclamation point. It will be understood that the next state controller of write state machine 32 branches from one state to another state regardless of the inputs to next state controller 72 when no combination of signals is indicated next to a branch.

When power is first applied to flash memory 20, the next state controller of the write state machine 32 brings up write state machine 32 in the POWER_UP state 720. No events occur in this state, and the next state controller simply waits for an active command signal from command state machine 28.

Assume that after entering state 720, the next state controller of write state machine 32 receives an active PROGRAM signal 38 and an inactive ERASE signal 40. This combination of signals initiates a program event, which will be performed on the byte indicated by address lines 24. The indicated byte will be programmed substantially to the value indicated on data lines 26. For this situation, the next state controller of write state machine 32 takes branch 726 to the PROG_SET UP state 732.

In the PROG_SET UP state 732, write state machine 32 is configured for a program event. In state 732, the period counter of write state machine 32 is reset and the event counter of the write state machine has its program count selected. The program path in flash memory array 74 is set up. Afterwords, the next state controller of the write state machine takes branch 734 to program state 736.

In PROGRAM state 736, the byte indicated by the signals AY 55 and AX 57 is programmed to a voltage level on the order of 6.5 volts, which is a logic zero. This is done by applying the program voltages to the gates, sources, and drains of the cells of the selected byte of the flash memory array 74 for a predetermined period of time. For one embodiment of the present invention, those programming voltages are as follows. The drain of each cell to be programmed is set to on the order of 6.5 volts. The gate of each cell to be programmed is set to on the order of 12 volts. The source of each cell to be programmed is grounded.

For one embodiment of the present invention, the predetermined amount of time for which the above-referenced programming voltages are applied to the selected cells is approximately 10 microseconds. That ten microsecond period is timed out by the period counter of write state machine 32. More particularly, during state 736, the period counter of write state machine 32 is configured for a program operation by selecting its program period. The write state machine 32 remains in state 736 until its period counter reaches its terminal count, which indicates that the programming voltages have been applied to the selected cells for a sufficient period of time to bring the stored voltage to on the order of 6.5 volts.

The next state controller of write state machine 32 takes branch 738 to the program equalization state PROGRAM_EQ 740 when PCTRTC 738 becomes active, which is a logical high.

The program equalization state 740 is an intermediate state between programming state 736 and the program verification state 742. The programming verification state 742 determines whether or not the previous programming operation was successful. This is done by reading what was written to flash memory array 74.

In program equalization state 740, the programming of the selected cells is disabled. In other words, the programming voltages are no longer applied to the selected cells of flash memory array 74. In program equalization state 740, a program column equalization operation is enabled.

Program equalization is accomplished as follows. Program equalization means that the discharge transistors 450 through 457 are enabled. The enablement of discharge transistors 450 through 457 is accomplished by write state machine 32 sending out a logical high pulse on line 80. That logical high pulse is the HDGNDSEN pulse. In one preferred embodiment of the present invention, that HDGNDSEN pulse is 0.5 microseconds long. A 0.5 microsecond HDGNDSEN pulse on line 80 enables discharge transistors 450 through 457 for approximately 0.5 microseconds. In an alternative embodiment of the present invention, the HDGNDSEN program equalization pulse can be shorter or longer. In one alternative embodiment, the HDGNDSEN program equalization pulse is approximately 0.05 microseconds in length.

The enablement of discharge transistors 450 through 457 causes each of them to conduct. This in turn shorts the selected bit line coupled to the particular discharge transistor to ground also. The period that the selected bit line is coupled to ground is approximately the same period of time as the particular discharge transistor is enabled—that is, turned on and providing a direct path to ground.

For example, if HDGNDSEN program equalization pulse of 0.5 microseconds is applied to the gate of discharge transistor 450, then discharge transistor 450 will be turned on. This in turn will short bit line 111 to ground because bit line 111 is coupled to the drain of discharge transistor 450 via transistors 350 and 380 of selector 300 and via line 340. The shorting of bit line 111 to ground in turn shorts the drains of the flash memory cells on bit line 111 to ground, including the drains of flash memory cells 150, 156, and 162, because the drains of those cells are coupled directly to bit line 111.

It is to be appreciated that when write state machine 32 sends out a program equalization point pulse on line 80, all eight discharge transistors 450 through 457 will be turned on. The discharge transistors 450 through 457 are each respectively coupled to a bit line of flash memory array 74. Those bit lines that are coupled to discharge transistors 450 through 457 are respectively in turn coupled to a respective column of flash memory cells of flash memory array 74. More particularly, those bit lines are coupled to the drains of those flash memory cells. Thus, when discharge transistors 450 through 457 are enabled for approximately 0.5 microseconds by an equalization pulse from write state machine 32, the drains of the cells of eight selected columns of flash memory array will be shorted to ground for approximately 0.5 microseconds.

Thus, the program equalization step of state 740 shorts to ground the drains of the flash memory cells that were programmed in state 736. The forcing of the drains of the selected cells to ground in the program equalization step speeds up the discharging of the drains of those cells.

In program equalization state 740, the period counter of the write state machine 32 is reset and the event counter of the write state machine is enabled, allowing that event counter to increment its count.

During the programming equalization state, and at the same time that program equalization is enabled, Y gating 72 and array 74 are enabled. This enables column select circuitry 94 and circuitry 96, which allows discharge transistors 450 through 457 to be electrically coupled to the selected flash memory cells.

After the program equalization enable state is over, the next state controller of write state machine 32 branches from state 740 to the program verification state 742 which is also referred to as the PROG_VAR_DELAY state 742.

In the program verification state 742, write state machine 32 verifies that the addressed byte has been successfully programmed. This is done by having the write state machine 32 compare the signal SOUT [0:7] on lines 59 to the program data stored in the data latch and comparator circuitry of write state machine 32. The period counter of write state machine 32 provides a verification delay to ensure that the data on SOUT [0:7] lines 59 is valid before verification is performed.

Flash memory array 74 is configured for program verification by enabling the word lines and by turning the read path on.

The verification state 742 is simply a read from flash memory array state. The read voltages are supplied to the gates, sources, and drains of the selected cells to be read from. Those read voltages are as follows. On the order of one volt is applied to the drains of the cells to be read from. On the order of 7.2 volts is applied to the gates of the cells to be read from. In other words, on the order of 7.2 volts is applied to the word lines of the cells to be read from. The sources of the cells to be read from are grounded.

In one embodiment of the present invention, approximately 2.0 microseconds is spent verifying whether the data has been programmed correctly. In an alternative embodiment of the present invention, approximately 0.2 microseconds is spent verifying whether data has been programmed correctly. In other alternative embodiments, the amount of time spent verifying can be shorter or longer.

The next state controller of write state machine 32 takes branch 744 out of the program verification state 742 back to the program set up state 732 if the previous program operation was not successful and the event counter of the write state machine has not exceeded the maximum program event count. Write state machine 32 cycles through states 732, 736, 740, and 742 until the selected byte is successfully programmed or the event counter of the write state machine 32 times out, whichever occurs first.

Assuming successful programming, one path for write state machine 32 to take is along branch 746 to state 748, then to state 750, and then to state 720.

Thus, for one embodiment, the total time for a single non-recursive programming sequence is approximately 12.5 microseconds—that is, 10 microseconds plus 0.5 microseconds plus 2.0 microseconds.

The erasing of memory array 72 is initiated by receipt of an active ERASE signal 38 and an inactive PROGRAM signal 40 while in the POWER_UP state 720. This combination of signals initiates an erase event and causes next state controller of write state machine 32 to take branch 762 to the ERASE state 764.

In ERASE state 764, the next state controller of WSM 32 initializes the write state machine 32 for array preconditioning by resetting the address, period, and event counters of WSM 32.

From ERASE state 160, the next state controller of WSM 32 branches to state 732 and begins array 74 preconditioning. Preconditioning entails programming each bit of at least one block of array 74 to a logic 0 prior to erasing the the block of the array.

During the erase operation, the next state controller of WSM 32 will cycle through states 732, 736, and 740 as described hereinabove with respect to program operations.

The next state controller of WSM 32 branches to the PROG_INC_ADD state 766 from state 742 if the addressed byte has been successfully preconditioned. In the PROG_INC_ADD state 766, events prepare the write state machine 32 to precondition another byte of memory.

The next state controller of WSM 32 branches from state 766 back to the PROG_SETUP state 732 unless the address counter of WSM 32 has reached its terminal count.

The write state machine 32 cycles through states 732, 736, 740, 742, and 766 until every byte of the block of the memory array 76 is preconditioned or a byte cannot be successfully preconditioned.

If all bytes have been successfully preconditioned, the next state controller of WSM 32 takes branch 758 to the ERASE-SETUP1 state 770 from states 750 and 748. The next state controller of WSM 32 then begins the process of erasing the array 74—, i.e. bringing the word line voltages to on the order of 3.25 volts.

In state 770, the address counter and event counter of WSM 32 are reset. These actions prepare the write state circuitry and the array for erasure.

From state 770, the next state controller of WSM 32 branches to ERASE_SETUP 2 state 772. Events during state 772 further prepare the WSM 32 for erasing the array. In state 772, the SBUS decodes cause the period counter of WSM 32 to be reset and the erase verify circuitry within the memory array 74 to turn on.

The next state controller of WSM 32 branches to the APPLY_ERASE state 776 from state 774. During state 776, the erase voltage is applied to the block of memory array 74 until the period counter of WSM 32 reaches its terminal count.

During the apply erase state 776, the erasure voltages are applied to all the cells of the block of the flash memory array 74 to be erased. For erasure, the gates of the cells are grounded, the sources of the cells are set to 12 volts, and the drains are left disconnected from any applied voltages. Hence, the drains of the cells float to some voltage level.

In one embodiment, the apply erase state 776 lasts approximately 10 milliseconds.

After the 10 millisecond period has elapsed, WSM 32 advances to ERASE_OFF state 778 from state 776.

In anticipation of erase verification procedures, in state 778 the period counter of WSM 32 is reset. The event counter of WSM 32 is enabled, allowing it to increment its count.

In erase off state 778, the column select circuitry 94 and circuitry 96 is enabled.

In erase off state 778, the equalization transistors 450 through 457 are enabled for a pulse of approximately 0.5 microseconds. The enablement of discharge transistors 450 through 457 in turn shorts the drains of the selected cells of flash memory array 74 to ground.

Next state controller of WSM 32 branches to erase verify state 780 from state 778.

During the ERASE_VERIFY state 780, the write state machine 32 determines whether the indicated byte of memory has been successfully erased. The events in state 780 configure the WSM 32 to perform the verification, and also execute the verification. During state 780, the period counter of WSM 32 is reset and its erase verification delay selected. The erase verification delay is approximately the time between when the erase voltage is removed and the SOUT[0:7] signals 59 are valid.

In state 780, the data latch and comparator circuitry of WSM 32 is configured to verify that the addressed byte has been successfully erased.

During state 780, the read path of memory array 74 is turned on and the array 74 is enabled, allowing array 74 to provide outputs SOUT[0:7] 59 to the WSM 32.

In one embodiment of the invention, the erase verify state 780 takes approximately 0.5 microseconds. In an alternative embodiment, the erase verify state takes approximately 0.2 microseconds.

The next state controller of WSM 32 branches back to state 772 from ERASE_VERIFY state 780 when an unerased memory location is reached and the address counter of WSM 32 has not yet reached its terminal count. Write state machine 32 will cycle through states 772, 776, 778, 780, 784, and 786 for each byte of the block of the memory array until the end of the block of the memory array 74 is reached or a byte cannot be successfully erased.

When every byte of the block of memory 74 has been successfully erased, next state controller of WSM 32 takes branch 788 to the POWER_UP state 720. The erasure of the array 74 is thus successfully completed.

For one embodiment, the total time for an erasure is variable given the iterations through states 772, 776, 778, 780, 784, and 786.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. A memory system comprising:

at least one programmable, non-volatile memory array located on a substrate, the memory array comprising a plurality of cells, each cell comprising a gate, source and drain;

a write state machine coupled to control operations to be performed on the memory array, said write state machine being located on the substrate, said write state machine coupled to receive commands to perform operations on the array, said write state machine issuing specific signals to perform certain operations on the memory array;

Y gating circuitry located on the substrate and coupled to the memory array to perform memory array operations such as reading data from the memory array, said gating circuitry comprising, column select circuitry to select a column on which the operation is to be performed, said column select circuitry comprising a first and second selection transistor, the drain of the first selection transistor connected to the drains of the memory cells of a column, the source of the first selection transistor connected to the drain of the second transistor and the gates of the first and second selection transistors coupled to receive column select signals to turn on the first and second selection transistors to select a column of the memory array to perform an operation, and;

equalization circuitry for equalizing the cells of the memory array, said equalization circuitry comprising at least one subcircuit comprising, a first, second and third pullup transistor, each transistor having a gate, source and drain, the drain of the first pullup transistor connected to a programming voltage, the gate of the first pullup transistor connected to a programming signal and the source of the first pullup transistor connected to the drain of the second pullup transistor and the drain of the third pullup transistor, the gate and source of the third pullup transistor coupled to a voltage, and the gates of the first and second pullup transistors coupled to a program signal, which, when enabled, turns on the first and second pullup transistors to cause the programming voltage to be placed at the source of the second selection transistor such that if the column is selected, the programming voltage is place at the drains of the cells of the selected column in the memory array, an equalization transistor having a gate, source and drain, said gate coupled to the write state machine to receive a equalization signal from the write state machine which turns on the equalization transistor while the equalization signal is asserted, said source of the equalization transistor connected to ground, and said drain connected to a sense amplifier, the second pull up transistor and the second selection transistor, such that when the equalization signal is asserted and the selection transistors are turned on to select the column of cells, the excess charge on the cells of the selected column of the memory array are discharge to ground through the equalization transistor.

2. The memory system as set forth in claim 1, wherein during a program operation said write state machine causes the program signal to be issued to place the programming voltage on the drains of the selected columns and causes the data to be programmed into the cells to be placed at the gates of the cells.

3. The memory system as set forth in claim 2 wherein the equalization signal is issued subsequent to the issuance of the program signal for a duration of approximately 0.5 microseconds.

4. The memory system as set forth in claim 2, wherein subsequent to the issuance of the equalization signal, said write state machine causes a program verify operation to be performed by placing a first read voltage on the drains of the cells and a second read voltage on the gates of the cells, wherein the cells are read to verify successful programming of the cells.

5. The memory system as set forth in claim 4, wherein the first read voltage is approximately equal to 1 volt and the second read voltage is approximately equal to 7.2 volts.

6. The memory system as set forth in claim 1, wherein during the execution of an erase operation said write state machine preconditions the array to a logic 0 prior to erasing the array.

7. The memory system as set forth in claim 6, wherein subsequent to preconditioning of the array, the write state machine causes a first erase voltage to be applied to the sources of the cells, the gates of the cells to be grounded and the drains of the cells to be disconnected to erase the cells.

8. The memory system as set forth in claim 7, wherein subsequent to erasure of the cells, said write state machine causes said equalization signal to be issued for approximately 0.5 microseconds to short the drains of the cells to ground.

9. The memory system as set forth in claim 8, wherein subsequent to issuance of the equalization signal, the write state machine causes an erase verify operation to be performed by placing a first read voltage on the drains of the cells and a second read voltage on the gates of the cells, wherein the cells are read to verify successful erasure of the cells.

10. A method for programming a nonvolatile memory array comprising a plurality of cells, each cell having a gate, source and drain, said method comprising the steps of:
providing a write state machine to control the timing and sequence of program operations to be performed;
providing column select circuitry to select a column on which the operation is to be performed;
providing equalization circuitry to which provides a programming voltage to the drains of the selected cells and equalizes selected cells under the command of the write state machine;
said write state machine applying program voltages to the gates, sources and drains of the cells to program, said drains set to a program voltage by the issuance of a program signal which causes the equalization circuitry to place the program voltage at the drains of the column of selected cells;
subsequent to applying program voltages, said write state machine issuing an equalization signal to the equalization circuit to short the drains of cells of selected columns to ground to equalize the selected cells;
once the cells are equalized, said write state machine causing the read voltages to be placed on the source, drain and gates of selected cells to verify the programming operation.

11. A method for erasing a nonvolatile memory array comprising a plurality of cells, each cell having a gate, source and drain, said method comprising the steps of:
providing a write state machine to control the timing and sequence of erasure operations to be performed by issuing the control signals to perform the operations;
providing column select circuitry to select a column on which the operation is to be performed;
providing equalization circuitry to which provides a programming voltage to the drains of the selected cells and equalizes selected cells under the command of the write state machine;
preconditioning the cells to erase by applying program voltages to the gates, sources and drains of the cells, said drains set to a program voltage by the issuance of a program signal which causes the equalization circuitry to place the program voltage at the drains of the column of selected cells;
issuing an equalization signal to the equalization circuit to short the drains of cells of selected columns to ground to equalize the selected cells;
issuing erase signals subsequent to the preconditioning of the cells, said erase signal causing the sources of selected cells to be set to 12 volts, the gates to be grounded and the drains to be disconnected to float; and
placing read voltages on the source, drain and gates of selected cells to verify the erase operation.

* * * * *

UNITED STATES PATENT AND TRADEMARK OFFICE
CERTIFICATE OF CORRECTION

PATENT NO.  : 5,265,059
DATED       : November 23, 1993
INVENTOR(S) : Steven E. Wells, et al It is certified that error appears in the above-indentified patent and that said Letters Patent is hereby corrected as shown below:

Column 7, line 41, Delete "62"  Insert in place thereof --92--
Column 7, line 53, Delete "th"  Insert in place thereof --the--

Signed and Sealed this

Nineteenth Day of September, 1995

Attest:

BRUCE LEHMAN

*Attesting Officer*  *Commissioner of Patents and Trademarks*